US007871925B2

(12) United States Patent
Kim et al.

(10) Patent No.: US 7,871,925 B2
(45) Date of Patent: Jan. 18, 2011

(54) STACK PACKAGE AND METHOD FOR MANUFACTURING THE SAME

(75) Inventors: Sung Min Kim, Seoul (KR); Min Suk Suh, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 53 days.

(21) Appl. No.: 12/404,474

(22) Filed: Mar. 16, 2009

(65) Prior Publication Data

US 2009/0181494 A1   Jul. 16, 2009

Related U.S. Application Data

(62) Division of application No. 11/647,704, filed on Dec. 29, 2006, now Pat. No. 7,525,186.

(30) Foreign Application Priority Data

Sep. 30, 2006   (KR) .................... 10-2006-0096717

(51) Int. Cl.
*H01L 21/4763* (2006.01)

(52) U.S. Cl. .................. 438/623; 257/620; 257/686; 257/E23.085

(58) Field of Classification Search .................. 438/623
See application file for complete search history.

(56) References Cited

U.S. PATENT DOCUMENTS 6,122,704 A * 9/2000 Hass et al. .................. 711/100
7,161,231 B2 * 1/2007 Koike ......................... 257/620
7,189,637 B2 * 3/2007 Uchikoshi et al. ........... 438/623
7,303,986 B2 * 12/2007 Uchikoshi et al. ........... 438/623
2006/0220230 A1   10/2006 Tanaka et al.
2007/0045780 A1   3/2007 Akram et al.

FOREIGN PATENT DOCUMENTS

| CN | 1338117 A | 2/2002 |
| JP | 2001-68618 A | 3/2001 |
| KR | 1020030050665 A | 6/2003 |
| KR | 1020060049323 A | 5/2006 |
| KR | 1020060073463 A | 6/2006 |
| WO | 01/39267 A1 | 5/2001 |

* cited by examiner

*Primary Examiner*—Jarrett J Stark
*Assistant Examiner*—Nicholas Tobergte
(74) *Attorney, Agent, or Firm*—Ladas & Parry LLP

(57) ABSTRACT

A stack package comprises a substrate having a circuit pattern; at least two semiconductor chips stacked on the substrate, having a plurality of through-via interconnection plugs and a plurality of guard rings which surround the respective through-via interconnection plugs, and connected with each other by the medium of the through-via interconnection plugs; a molding material for molding an upper surface of the substrate including the stacked semiconductor chips; and solder balls mounted to a lower surface of the substrate.

7 Claims, 5 Drawing Sheets

STACK PACKAGE AND METHOD FOR MANUFACTURING THE SAME

CROSS-REFERENCE TO RELATED APPLICATIONS

The present application claims priority to Korean patent application number 10-2006-0096717 filed on Sep. 30, 2006, which is incorporated by reference in its entirety.

BACKGROUND OF THE INVENTION

The present invention relates to a stack package, and more particularly, to a stack package which is realized using a through-via interconnection plug and a method for manufacturing the same.

In the semiconductor industry, packaging technology for an integrated circuit has continuously been developed to meet the demand toward miniaturization and mounting reliability. Recently, as the miniaturization and high functionality of electric/electronic products are required, various techniques have been disclosed in the art.

The term "stack" in the semiconductor industry means a vertical stand or pile of at least two semiconductor chips or semiconductor packages, one atop the other. By using a stack of packages, in the case of a memory device for example, it is possible to produce a product having a memory capacity which is two times greater than that obtained through semiconductor integration processes. Also, a stack package provides advantages not only through an increase in memory capacity but also in view of a mounting density and mounting area utilization efficiency. Due to this fact, researches and development for a stack package have been accelerated.

As an example of a stack package, a stack package structure has been disclosed in the art, in which through-via interconnection plugs are formed in chips to physically and electrically connect upper and lower chips with each other. A prior art method for manufacturing a stack package using through-via interconnection plugs is as described below.

A hole is defined in a predetermined portion of each chip at a wafer level through an etching process. After an oxide layer is formed on the surface of the hole, a connection plug made of a metal is formed in the hole. The connection plug made of a metal is formed by electro-plating. A seed metal layer made of a conductive metal is deposited over the oxide layer through CVD or PVD. An electro-plating process is implemented to fill the hole with a metal. Then, in order to expose an end of the connection plug which faces the backside of the wafer, the backside of the wafer is back-grinded.

After the wafer is sawed and separated into individual chips, at least two such chips can be stacked on a substrate having a circuit pattern using the connection plugs. If the stack is completed in this way, the upper surface of the substrate including the stacked chips is molded, and solder balls are mounted on the lower surface of the substrate, by which the manufacture of a stack package is completed.

In this type of conventional stack package in which the chips are connected with each other using the through-via interconnection plugs, when performing a thermal cycle reliability test, cracks and disconnections are likely to be produced at joint regions between the connection plugs, because of thermal expansion and contraction. As a result, joint reliability deteriorates. Since joint reliability deteriorates, device reliability deteriorates.

SUMMARY OF THE INVENTION

The present invention is directed to a stack package in which chips are connected by connection plugs filling through-vias while allowing relaxation of a stress upon a thermal cycle test to thereby prevent cracks and disconnections from being produced at joint regions between the chips, and a method for manufacturing the same.

Also, the present invention is directed to a stack package which prevents cracks and disconnections from being produced at joint regions between chips, thereby improving the reliability of a solder joint, and a method for manufacturing the same.

In one embodiment, a stack package comprises a substantially planar substrate with opposing and substantially planar upper and lower surfaces, at least one of which can also have a circuit pattern. At least two semiconductor chips are stacked on top of each other on the substrate, one or both of them having a plurality of through-via interconnection plugs by which the two chips are electrically coupled to each other and/or to circuits external to the package. A guard ring surrounds the through-via interconnection plugs. The two or more semiconductor chips are connected to each other by way of the through-via interconnection plugs. A molding material over-molds or encapsulates both an upper surface of the substrate and the stacked semiconductor chips. Solder balls are attached to the lower surface of the substrate and provide electrical contact points for the assembled package.

Each through-via interconnection plug projects from a lower surface of each semiconductor chip.

Each through-via interconnection plug comprises a through-hole which is defined through the semiconductor chip, and a metal layer which fills the through-hole.

Each guard ring is formed to electrically separate the through-via interconnection plug from the rest of the semiconductor chip.

Each guard ring comprises a groove or slot that is formed through the semiconductor chip and then filled with an insulating material. The groove or slot in one embodiment is in the shape of a quadrangular frame.

In another embodiment, a method for manufacturing a stack package comprises preparing a wafer comprising semiconductor chips each having a through-via interconnection pattern forming region; defining through each semiconductor chip, a first groove which surrounds the through-via interconnection pattern forming region plug; filling an insulation layer in the first groove; defining a second groove through the through-via interconnection pattern forming region of the semiconductor chip inside the first groove filled with the insulation layer; filling a metal layer in the second groove; forming a through-via interconnection plug and a guard ring surrounding the through-via interconnection plug by back-grinding a backside of the semiconductor chip to expose the insulation layer filled in the first groove and the metal layer filled in the second groove; sawing the wafer to obtain the semiconductor chips each of which is formed with the through-via interconnection plug and the guard ring surrounding the through-via interconnection plug; stacking at least two semiconductor chips each of which is formed with the through-via interconnection plug and the guard ring surrounding the through-via interconnection plug, on a substrate having a circuit pattern, such that the through-via interconnection plugs of the semiconductor chips are connected with each other; molding an upper surface of the substrate including the stacked semiconductor chips using a molding material; and mounting solder balls to a lower surface of the substrate.

After the step of forming a through-via interconnection plug and a guard ring surrounding the through-via interconnection plug by back-grinding a backside of the semiconductor chip, and before the step of stacking semiconductor chips each of which is formed with the through-via interconnection plug and the guard ring surrounding the through-via interconnection plug, the method further comprises the step of etching the backside of the back-grinded semiconductor chip to allow the through-via interconnection plug to project from the backside of the semiconductor chip.

The first groove is defined in the shape of a quadrangular frame which surrounds the through-via interconnection pattern forming region.

The step of filling an insulation layer in the first groove comprises the sub steps of depositing an insulation layer on the semiconductor chip to fill the first groove; and removing a portion of the insulation layer which is deposited on a surface of the semiconductor chip excluding the first groove.

The second groove is defined to be separated from the first groove filled with the insulation layer.

The step of filling a metal layer in the second groove comprises the sub steps of depositing a seed metal layer on the semiconductor chip including the second groove; depositing a metal layer on the seed metal layer through an electroplating process to fill the second groove; and removing portions of the metal layer and the seed metal layer which are deposited on the surface of the semiconductor chip excluding the second groove.

The first and second grooves are defined through an etching process which uses a photoresist pattern as an etch mask.

DETAILED DESCRIPTION

In the present invention, when manufacturing a stack package, a stack of two or more semiconductor chips is formed using electrically conductive through-via interconnection plugs. The through-vias extend through at least one of the semiconductor chips to be stacked and enable the two stacked semiconductor chips to be electrically coupled to each other. The through vias are surrounded by guard rings which absorb thermally-induced stresses and which provide an electrical insulation around the respective through-via interconnection plugs.

In a stack package, the guard ring electrically insulates a through-via interconnection pattern and the inside of a chip from each other. The guard ring reduces or eliminates thermally-induced stress that can be concentrated on the through-via interconnection plug when the chip's temperature fluctuates. The guard ring prevents stress from being concentrated on the through-via interconnection plug and reduces or eliminates cracks in a semiconductor device at joint regions between the through-via interconnection plugs.

Figure 1:
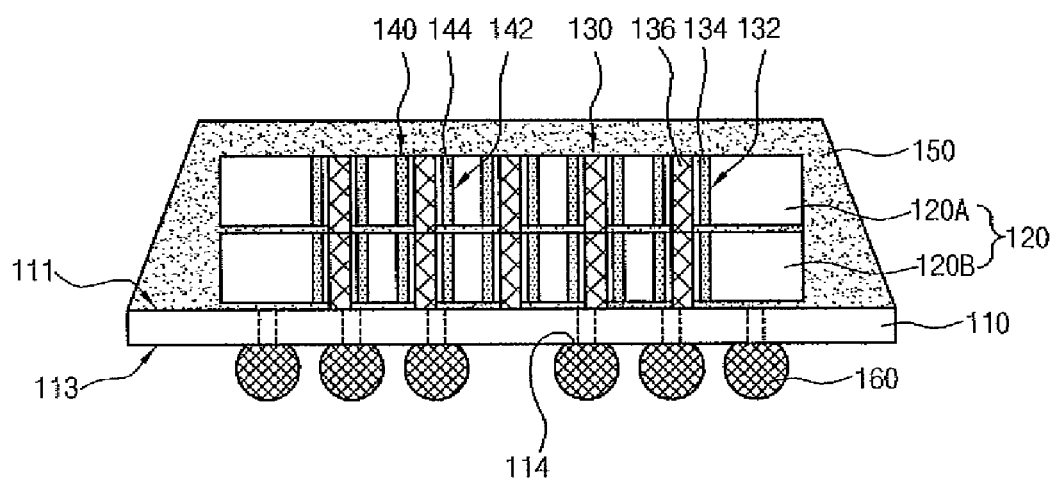
FIG. 1 is a cross-sectional view illustrating a semiconductor device using the stack package and through-via interconnection plugs in accordance with an embodiment of the present invention.

FIG. 1 is a cross-sectional view of a semiconductor device made using a stack package in accordance with an embodiment of the present invention. Referring to FIG. 1, at least two semiconductor chips 120A and 120B are stacked on top of each other and electrically coupled to each other by through-via interconnection plugs 130 that extend through the chips 120A and 120B. In an alternate embodiment, only one of the two semiconductor chips 120A and 120B may have through-via interconnection plugs 130, in which case, the bottom chip is provided with interconnection plugs 130 that provide electrical contacts and pathways for the top chip using through-via interconnection plugs 130 that extend through the bottom chip 120B.

In the embodiment shown in FIG. 1, the substrate 110, which is substantially planar, i.e., having a substantially planar upper surface 111 and a substantially planar lower surface 113, also has a circuit pattern on the upper surface 101. By way of the interconnection plugs 130, the semiconductor chips 120A and 120B can be electrically coupled to a circuit pattern on the substrate 110. In such an embodiment, a plurality of electrode terminals and conductive pathways are placed and arranged on the upper surface 111 of the substrate 110. A plurality of ball lands 114 (not visible in the figures) are arranged on the lower surface 113 of the substrate 110. Electrical connection between the ball lands 114 and contacts on the upper surface 111 is provided by conductive vias (not shown) that extend through the substrate 110.

Although two semiconductor chips 120 are shown stacked on top of each other in FIG. 1, it should be understood that three or more semiconductor chips can also be stacked upon one another as the occasion demands.

Still referring to FIG. 1, the semiconductor chips 120A and 120B shown in FIG. 1 are physically and electrically connected to each other by electrically-conductive through-via interconnection plugs 130. The through-via interconnection plugs 130 are electrically connected with electrical contact pads on the surfaces of of the semiconductor chips 120, which contact pads not shown in the figures for clarity.

Each through-via interconnection plug 130 comprises a through-hole 132, that extends completely through the chip 120 and which is filled with a metal 136. The bottom end of the through-via interconnection plug 130, which is the end of the through-via interconnection plug 130 that is closest to the the lower surface 126 of a semiconductor chip 120, is sized, shaped and arranged such that it projects from the lower surface 126 of the semiconductor chip 120.

A guard ring 140 is formed in the semiconductcor chip 120 so that it surrounds the through-via interconnection plug 130. The guard ring 140 electrically insulates the through-via interconnection plug 130 and the inside of the semiconductor chip 120 from each other. The guard ring 140 also acts to absorb mechanical stress, which is transmitted to the through-via interconnection plug 130.

When viewed from the top, the guard ring 140 has the shape of a quadrangular frame, and is separated from the through-via interconnection plug 130. The guard ring 140 comprises a groove or slot 142, which extends through the semiconductor chip 120 and has a sectional shape of a quadrangular frame. An electrically insulating material layer 144 fills the hole 142.

In order to protect the semiconductor chips 120, the upper surface 111 of the substrate 110 and the stacked semiconductor chips 120A and 120B are over-molded or encapsulated within a molding material 150 such as an EMC (epoxy molding compound). Solder balls 160, which serve as as connection points to external circuits, not shown, are mounted to the lower surface 113 of the substrate 110. More particularly, the solder balls 160 are attached to ball lands 114 (not shown) formed on the lower surface 123 of the substrate 110.

In the stack package according to the present invention, constructed as mentioned above, due to the fact that the guard ring is formed around the through-via interconnection plug 130, it is possible to relax or prevent stress concentration at the joint regions between the through-via interconnection plugs. Thus, it is possible to prevent cracks and disconnections from being produced at the joint regions due to the stress, and as a result, the reliability of the stack package can be improved.

In the through-via interconnection plug according to the conventional art, an oxide layer for electrical insulation is formed on the sidewall of a through-hole. However, in the present invention, since the guard ring performs an electrical insulation function, it is not necessary to form the oxide layer. Therefore, various problems that can be caused by use of an oxide layer can be reduced or completely eliminated.

FIGS. 2A through 2H are plan views and cross-sectional views which illustrate a method for manufacturing a stack package as well as a semiconductor device using a stack package, in accordance with another embodiment of the present invention.

Figure 2A:
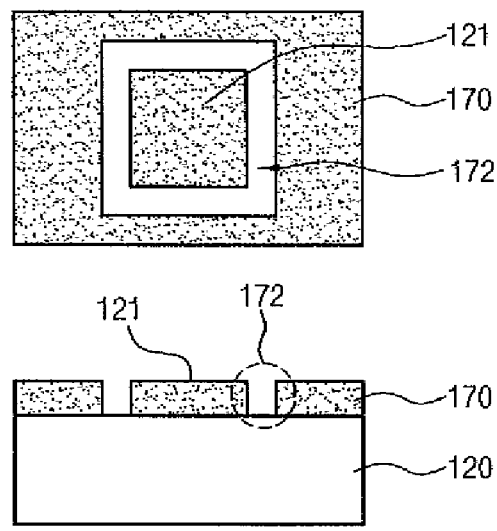
FIGS. 2A through 2H are plan views and cross-sectional views for explaining a method for manufacturing a stack package in accordance with another embodiment of the present invention.

Referring to FIG. 2A, a portion of semiconductor wafer, is shown. Although the semiconductor wafer is comprised of several semiconductor chips 120, only a portion of one chip is shown in FIGS. 2A-2G. The wafer can be sawn apart into several separate chips, 120, each of which can be used as individual chips 120.

Figure 2B:
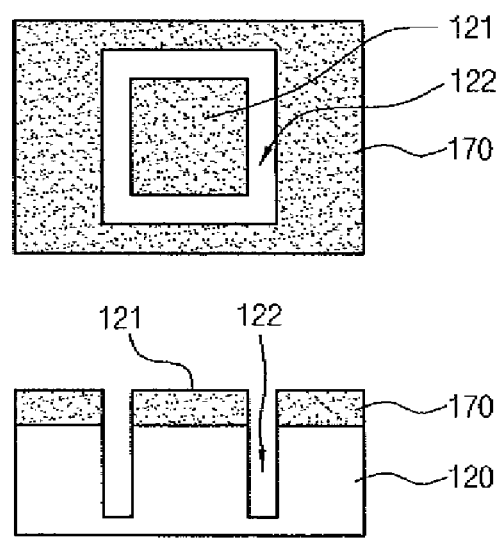

Each semiconductor chip 120 of the wafer has at least one but preferably a plurality of through-via interconnection pattern forming regions, one such region being identified in FIG. 2A and 2B by reference numeral 121. As shown in FIG. 2A, a first photoresist pattern 170, which has a quadrangular frame-shaped opening 172, where no photoresist is patterned is deposited, leaving an unpatterned, quadrangular frame-shaped area 172 surrounds the through-via interconnection plug forming region 121. The frame-shaped opening 172 in the photoresist 170 is formed by applying photoresist and sequentially implementing exposure and development of the photoresist.

Referring now to FIG. 2B, through etching the exposed portion of the semiconductor chip 120 using the first photoresist pattern 170 as an etch mask, a first slot or groove 122 is formed into the chip 120. As can be seen in the top view of FIG. 2B, the groove 122 extends all the way around the through-via interconnection plug forming region 121. Put another way, since the first photoresist pattern 170 was formed in the shape of a quadrangular frame, the first groove 120 surrounding the through-via interconnection plug forming region 121 is also a quadrangular frame.

Figure 2C:
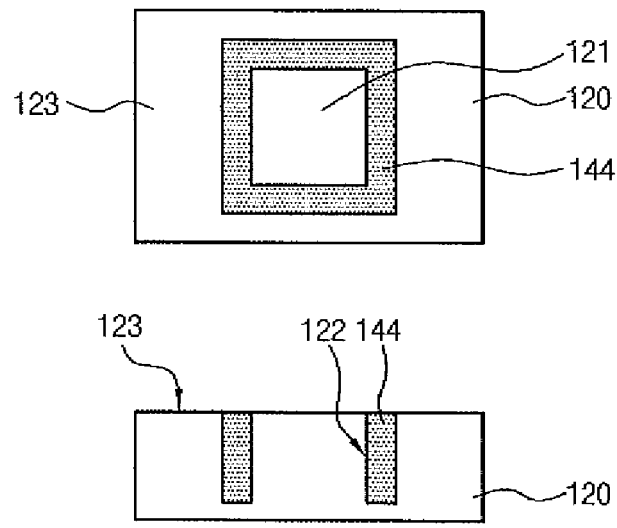
Figure 2D:
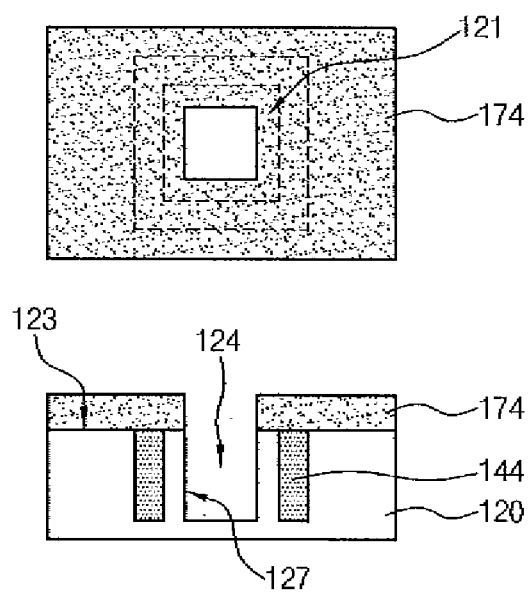

Referring now to FIG. 2C, the photoresist pattern 170 shown in FIG. 2A and 2B is removed from the top surface 123 of the chip 120. After the photoresist pattern is removed, an insulation layer 144 is deposited onto the top surface 123 of the semiconductor chip 120, which also fills the first groove 122. After the first groove 120 is filed, the portion of the insulation layer 144 deposited onto the top surface 123 of the semiconductor chip 120 is removed, except for the insulation material 144 that filled the first groove 122. The insulation layer 144 that filled the first groove 122 remains within the groove 122, Referring now to FIG. 2D, a second photoresist pattern 174 is applied to the top surface 123 of the chip 120 in a pattern that exposes the through-via interconnection plug forming region 121. A pattern in the photoresist 174 is formed by sequential exposure and development of the photoresist 174.

A second groove or hole 124 is formed at least part way through the chip 120 by etching the through-via interconnection plug forming region 121 of the exposed semiconductor chip 120 using the second photoresist pattern 174 as an etch mask. The second groove or hole 124 has an area such that the second groove or hole 124 is separated from the first groove 122, previously filled with the insulation layer 144, by the silicon or other material from which the chip 120 is formed.

Figure 2E:
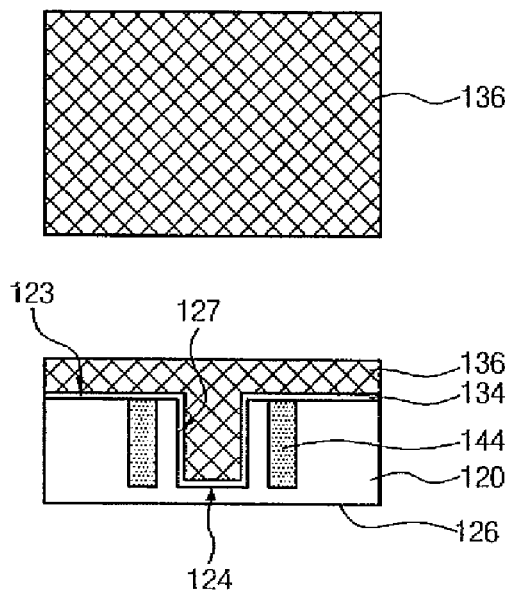

Referring now to FIG. 2E, after the second photoresist pattern 174 is removed from the top surface 123 of the chip 120, a seed metal layer 134 comprising a metal thin film is deposited onto the top of the semiconductor chip 120. The metal layer 134 that is deposited is also deposited over the inside surface 127 of the second groove 124. Then, using an electro-plating process, a metal layer 136 is deposited over the seed metal layer 134, also filling the second groove 124 with the metal layer 136 material.

Figure 2F:
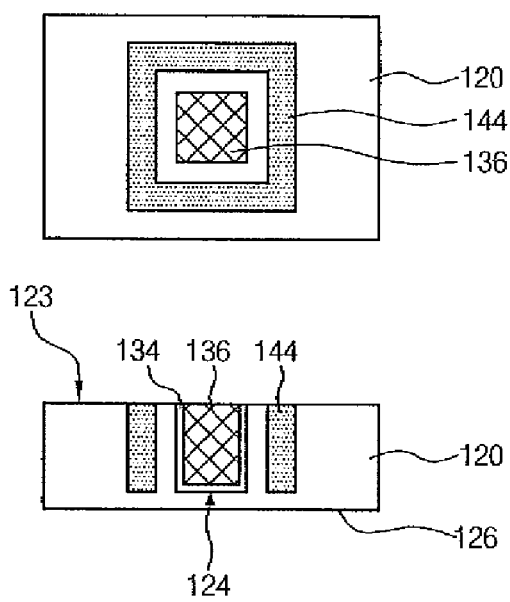

Referring to FIG. 2F, using either an etch-back or CMP (chemical mechanical polishing) process, portions of the metal layer 136 and the seed metal layer 134, which are deposited on the top surface 123 of the semiconductor chip 120 are removed, except for the metal layer 136 that filled the second groove 124 leaving a metal-filled hole or slot 124 that extends almost all the way through the chip's 120 silicon substrate. Since the metal that fills the hole or slot 124 is completely surrounded by the insulation-filled groove 144, which is completely filled with with the aforementioned insulation material, the metal 136 that fills the hole 124 is therefore electrically isolated from the rest of the substrate 120.

Figure 2G:
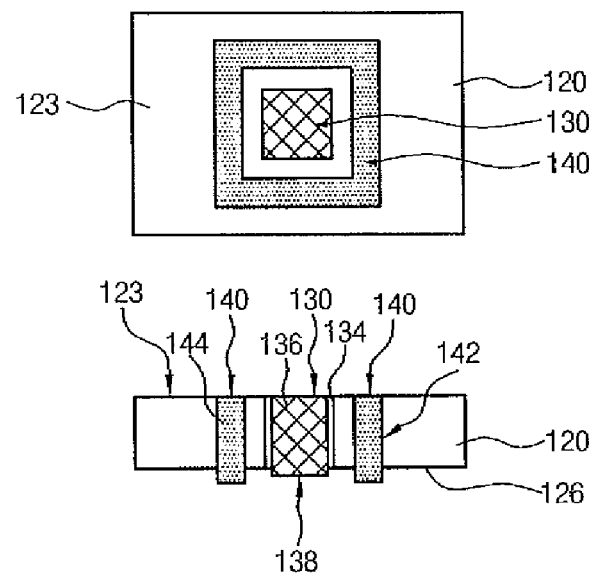

Referring to FIG. 2G, the top surface 123 of the semiconductor chip 120 is back-ground such that the insulation layer 144 filled in the first groove 122 and the metal layer 136 filled in the second groove 124 are exposed. Through back grinding, the through-via interconnection plug 130, is formed by the metal layer 136 filling the through-hole 132. The groove 144 that surrounds the through-via interconnection plug 132 and which is filled with an insulating material and which is in the shape of a quadrangular frame, electrically isolates, i.e., insulates the through-via interconnection plug 130 from the rest of the chip 12. The groove 144 filled with insulative material and which surrounds the through-via interconnection forms the aforementioned guard ring 140, shown in cross section in FIG. 1. The lower surface 126 of the semiconductor chip 120 is wet-etched or plasma-etched, such that the lower end 138 of the through-via interconnection plug 130 projects above the lower surface 126 of the semiconductor chip 120.

Figure 2H:
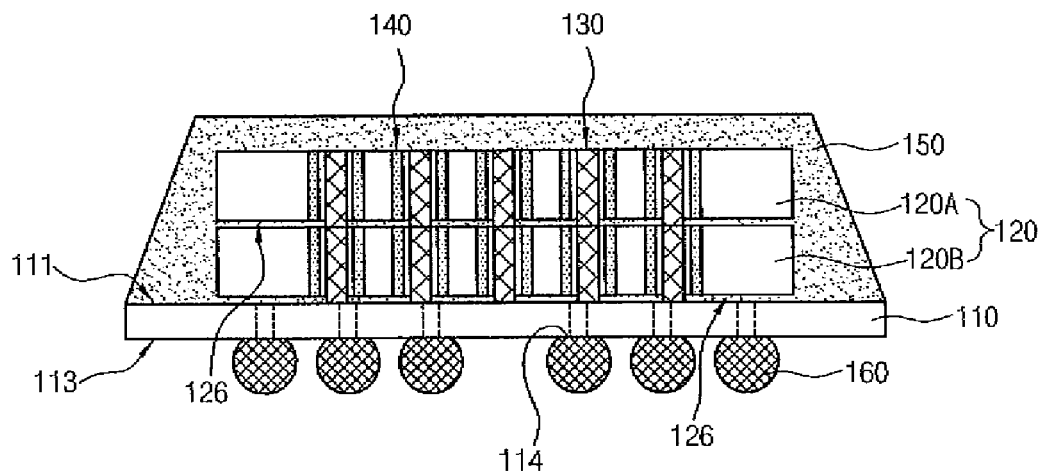

Referring to FIG. 2H, the wafer having the semiconductor chips 120A and 120B and which have the aforementioned through-via interconnection plugs 130 and the guard rings 140 surrounding the through-via interconnection plugs 130, can besawed and separated into individual semiconductor chips 120A and 120B. Then, at least two, for example, two semiconductor chips 120A and 120B are stacked on the substrate 110. While not shown in the drawing, the substrate 110 has a circuit pattern, preferably on its top surface 111, however, a circuit pattern could also be located on the bottom surface 113 as well as on both the top 111 and the bottom surface 113. Electrode terminals (not shown) are arranged on the upper surface 111 of the substrate 110, and ball lands 114 are arranged on the lower surface 113 of the substrate 110. The stack of the semiconductor chips 120A and 120*b* are physically and electrically connected with each other by way of the through-via interconnection plugs 130, which project from the lower surface 126 of the semiconductor chips 120A and 120B.

In order to protect the semiconductor chips 120A and 120B, the upper surface 111 of the substrate 110 and the stacked semiconductor chips 120A and 120B, are encapsulate or overmolded with molding material 150. The solder balls 160 serve as electrical connectors to an external circuit, to which the solder balls 160 can be mounted. In this way, the manufacture of the stack package according to the present invention is completed.

In the method for manufacturing a stack package according to the present invention, the manufacturing procedure before sawing the wafer is implemented with the corresponding wafer attached to a supporter.

As is apparent from the above description, in the present invention, when stacking semiconductor chips, through-via interconnection plugs can be used to electrically connect two or more stacked chips with one another, and guard rings having a shape which surround the through-via interconnection plugs are formed. By using the aforementioned through-via interconnection plugs, stresses induced by thermal expansion and contraction can be decreased or eliminated.

Since the semiconductor chips can be physically and electrically connected with one another in an easy manner while ensuring reliable joints, the overall reliability of the stack package can be improved.

When forming a through-via interconnection plug using prior artoxide layer, electrical insulation is accomplished by an oxide layer formed on the sidewall of a through-hole. However, in the present invention, because the guard ring ensures electrical insulation, it is not necessary to form an oxide layer. Accordingly, in the present invention, various problems which can be caused due to the formation of the oxide layer are avoided.

In the drawings and specification, there have been disclosed specific embodiments of the invention and, although specific terms are employed and a specific description of embodiments have been provided, the scope of the invention is set forth in the following claims.

What is claimed is:

1. A method for manufacturing a stack package, comprising the steps of:
    preparing a wafer having upper and lower surfaces and comprising a plurality of semiconductor chips, at least one of said chips having at least one through-via interconnection pattern forming region;
    forming a first groove that surrounds the through-via interconnection pattern forming region;
    filling an insulation layer into the first groove to substantially fill the first groove with electrically insulating material to thereby form a guard ring around the through-via interconnection pattern forming region;
    forming a hole through the through-via interconnection pattern forming region, said hole being inside the first groove;
    applying a metal to the hole in the through-via interconnection pattern forming region;
    forming a through-via interconnection plug by back-grinding a backside of the semiconductor chip to expose the insulation layer material in the first groove and to expose the metal layer in the hole;
    sawing the wafer to obtain first and second semiconductor chips, at least one of which is formed with the through-via interconnection plug and the guard ring surrounding the through-via interconnection plug;
    stacking at least two semiconductor chips, at least one of which is formed with the through-via interconnection plug and the guard ring, onto a substrate having upper and lower surfaces and a circuit pattern on at least one of the upper and lower surfaces, such that the semiconductor chips are electrically coupled to each other via the through-via interconnection plugs;
    overmolding a material over the upper surface of the substrate and the stacked semiconductor chips; and
    mounting solder balls to the lower surface of the substrate.

2. The method as set forth in claim 1, wherein, after the step of forming a through-via interconnection plug and a guard ring by back-grinding, and before the step of stacking the semiconductor chips, the method further comprises the step of:
    etching the backside of the back-grinded semiconductor chip to allow the through-via interconnection plug to project from the backside of the semiconductor chip.

3. The method as set forth in claim 1, wherein the first groove is defined in the shape of a quadrangular frame around the through-via interconnection pattern forming region.

4. The method as set forth in claim 1, wherein the step of filling an insulation layer in the first groove comprises the sub steps of:
    depositing an insulation layer on the semiconductor chip to fill the first groove; and
    removing a portion of the insulation layer which is deposited on a surface of the semiconductor chip excluding the first groove.

5. The method as set forth in claim 1, wherein the hole is separated from the first groove filled with the insulation layer.

6. The method as set forth in claim 1, wherein the step of filling a metal layer in the hole comprises the sub steps of:
    depositing a seed metal layer on the semiconductor chip including the hole; depositing a metal layer on the seed metal layer through an electro-plating process to fill the hole; and
    removing portions of the metal layer and the seed metal layer which are deposited on the surface of the semiconductor chip excluding the hole.

7. The method as set forth in claim 1, wherein the first groove and the hole are formed using an etching process, which uses a photoresist pattern as an etch mask.

* * * * *